United States Patent [19]

Petersen

[11] Patent Number: 5,123,855
[45] Date of Patent: Jun. 23, 1992

[54] ZERO INSERTION FORCE CONNECTOR FOR PRINTED CIRCUIT BOARDS

[75] Inventor: Kurt H. Petersen, Austin, Tex.

[73] Assignee: Minnesota Mining and Manufacturing Company, St. Paul, Minn.

[21] Appl. No.: 692,366

[22] Filed: Apr. 26, 1991

[51] Int. Cl.⁵ .............................................. H01R 13/15
[52] U.S. Cl. ..................................... 439/263; 439/266
[58] Field of Search ............... 439/259, 260, 263, 261, 439/264, 267, 266, 268, 269, 270, 525

[56] References Cited

U.S. PATENT DOCUMENTS

| | | |
|---|---|---|
| 2,261,761 | 11/1941 | Hanson et al. ..................... 439/264 |
| 3,569,905 | 3/1971 | Kehagtoglou . |
| 3,763,459 | 10/1973 | Millis . |
| 4,012,099 | 3/1977 | Worcester . |
| 4,343,524 | 8/1982 | Bright et al. . |
| 4,505,532 | 3/1985 | Hine et al. ........................ 439/264 X |
| 4,744,768 | 5/1988 | Rios .................................... 439/262 |
| 4,988,310 | 1/1991 | Bright et al. ................... 439/259 X |
| 5,002,499 | 3/1991 | Matsuoka ......................... 439/342 |
| 5,013,256 | 5/1991 | Matsuoka et al. ................ 439/264 |

Primary Examiner—Larry I. Schwartz
Assistant Examiner—Khiem Nguyen
Attorney, Agent, or Firm—Gary L. Griswold; Walter N. Kirn; John C. Barnes

[57] ABSTRACT

A pin-grid-array socket which has a cam plate for urging the normally open contacts from a normally open position to a normally closed position. A spring member is positioned in the socket to urge the cam plate to the closed position and maintain a force on the contacts to prevent premature failure of the socket.

6 Claims, 5 Drawing Sheets

ZERO INSERTION FORCE CONNECTOR FOR PRINTED CIRCUIT BOARDS

BACKGROUND OF THE INVENTION

1. Field of the Invention

The present invention generally relates to pin grid array sockets for connecting and disconnecting integrated circuit devices or packages to and from circuit boards, and more particularly to sockets where the insertion force to connect the device to the socket is zero and the device is maintained in the socket and the electrical connection is maintained under spring tension.

2. Description of the Prior Art

Low insertion force sockets have been well known in the art for securing electronic packages with a large number of leads in the form of pin contacts in a predetermined array onto a printed circuit board. Such sockets are used for making tests on the device and for inserting a device onto a printed circuit board. As the density of the circuits in a device increases, the number of connections is increased and the use of low or zero insertion force sockets increases. Further, instead of their use mainly for testing, devices may remain on circuit boards and the use of sockets which permit ready replacement of such devices is desirable.

Examples of the prior art sockets or connectors providing zero or low insertion force are found in U.S. Pat. Nos. 4,744,768; 4,343,524; 4,012,099; 3,763,459; and 3,569,905.

In some of these patents the contacts are formed to be in a normally closed position and this is afforded by the shape of the contact and the resilience of the material from which they are made. The contact force onto the leads of the device is determined by the individual contacts in this type socket. In this construction a cam is actuated to move a cam plate which serves to separate the legs of the contacts for insertion of the lead from the integrated circuit package between the legs of the contact.

In others, the contacts are normally open due to their design and are closed and held closed by the use of a cam which is rotated to move a cam plate such that the cam plate urges the legs of all the contacts to a closed position onto the leads of the devices by the force of a cam. In these devices the cam plate is made of plastic or polymeric material, as is the support for the cam, and in time there is a tendency for the polymeric material to cold flow and change the contact force on the lead of the package.

In U.S. Pat. No. 3,763,459 the socket described uses a leaf spring to urge the central section toward the open position, but as explained in Column 5, lines 28 through 33, the spring may be positioned to urge the central section toward a closed position. This patent further teaches using the force of a spring element under the bias of a crank to urge two cam plates in directions to afford the closing of the contacts onto the leads of a semiconductor device, see column 7, lines 51 through 57.

In U.S. Pat. No. 3,569,905 there is disclosed a normally open contact construction which is closed by a cam plate. In this device, the cam plate, rather than moving generally perpendicular to the lead to close the contact upon the lead, moves axially of the lead. The cam plate is urged in one direction to allow the opening of the contacts by a serpentine leaf spring or by a compression coil spring. The contacts are closed against the pressure of the springs by a fluid actuated chamber and to grasp the pin contact of an integrated circuit device. In this device as in the others, if the connection is to be maintained for any period of time there is going to be a loosening of the grip on the contact due to the escape of the fluid from the chamber, the cold flow of the polymeric material under the pressure of the springs, a weakening of the spring force of the individual contacts, or a combination thereof.

The present invention includes in the structure of the socket, a spring which is designed to prevent premature failure of a pin grid array socket in that it supplements the binding or connecting force and takes up the slack that can develop over time. The invention is described with respect to normally open socket contact constructions although the sockets described are placed in both categories. One embodiment is normally closed and can be opened by a pressure loading device during the insertion or removal of an integrated circuit package, and the other is normally open to receive the package and is closed onto the leads of the package by operation of a handle.

SUMMARY OF THE INVENTION

The present invention provides a low insertion force socket for receiving an integrated circuit package with multiple leads in an array and includes means for restricting the loss of contact force between the contacts thereof and the leads of the package. The socket comprises a base having openings for contact tails or pins, a top plate having openings for receiving the leads of a said package, a plurality of individual contacts for making connection between the leads of a package and an external electronic article, the contacts each comprising at least one arm which is movable into engagement with a lead of a package, a cam plate positioned between the base and the top plate, for receiving each contact and for moving at least one arm of each contact between an open and a closed position upon movement of the cam plate in relationship to the base and the top plate, spring means positioned for engagement with the cam plate to urge the cam plate in a direction to move the arm of each contact to close against and to make contact with the leads, and means for releasing the pressure from the spring means for releasing the arm of the contact from the force of the cam plate.

BRIEF DESCRIPTION OF THE DRAWINGS

The present invention will be further described hereinafter with reference to the accompanying drawing wherein.

DESCRIPTION OF THE PRESENTLY PREFERRED EMBODIMENTS

Figure 1:
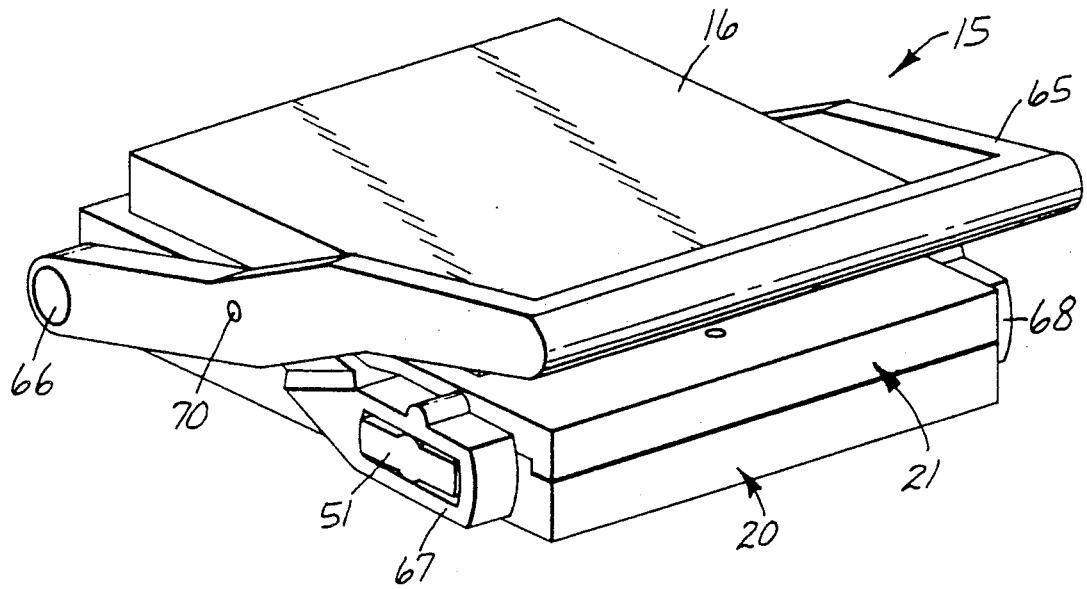
FIG. 1 is a perspective view of a socket according to the present invention with an integrated circuit package in place on the socket.
Figure 3:
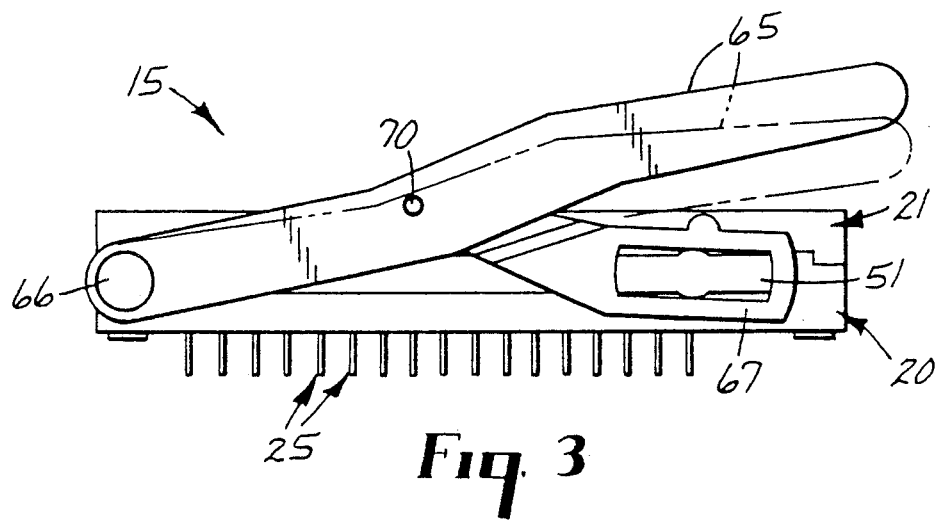
FIG. 3 is a top view of the socket.
Figure 2:
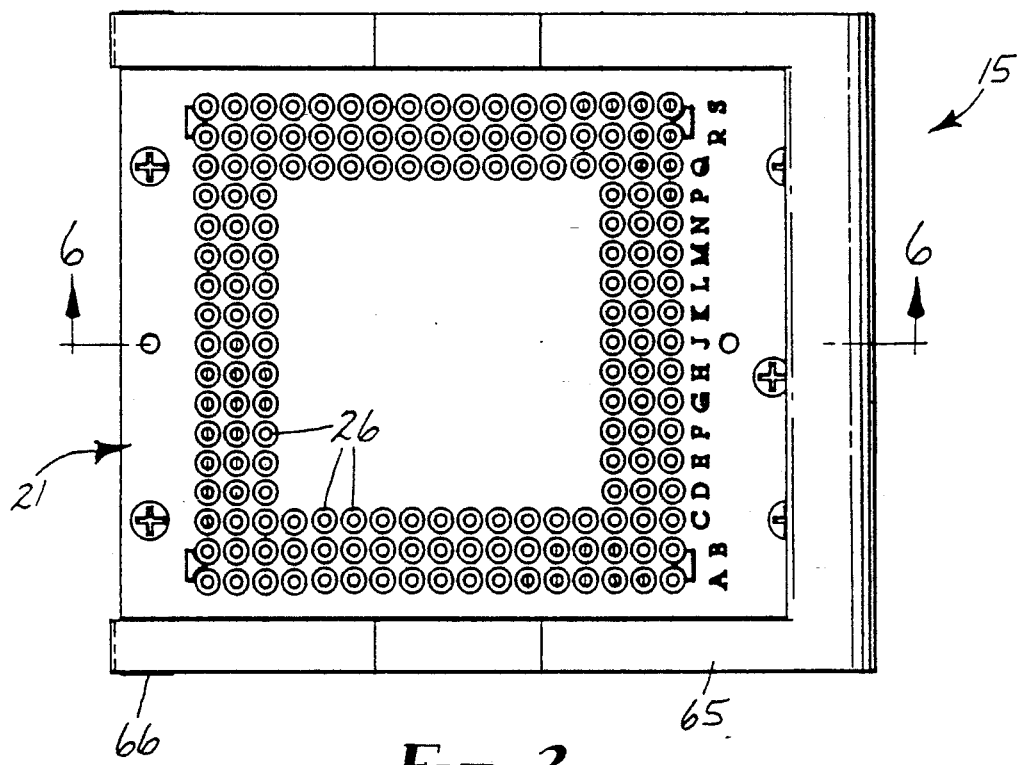
FIG. 2 is a side elevation of the socket of FIG. 1 illustrating the movement of the lever in broken lines.

The pin grid array socket of the present invention will now be described in greater detail with reference to the accompanying drawing wherein like reference numerals refer to like parts throughout the several views.

The socket 15, illustrated in FIG. 1, is adapted to mount an integrated circuit package 16 to a printed circuit board not shown. The package 16 is provided with a plurality of leads disposed in a predetermined array, all of which are inserted with low or zero insertion force into separate cells in the socket 15 to be connected with contacts which join the leads electrically to the circuit board.

The socket 15 comprises a base 20, a top plate 21, and a cam plate 22 which is disposed between said base 20 and top plate 21. The top plate 21, the cam plate 22 and the base 20 all have a generally rectangular configuration with opposite surfaces joined by side and end walls. Openings are formed in each of these members between the opposite surfaces and are generally aligned to define contact receiving passages. As perhaps best illustrated in FIG. 7, the top plate 21 is formed with through openings, each defined by a circular countersink portion 26 which is connected to rectangular-shaped portion 27 formed in the recessed under-surface. The flared or countersink openings 26 aid to guide the leads from a package 16 into the socket 15. The rectangular openings 27 serve to receive the ends of a plurality of Y-shaped contacts 25.

Figure 7:
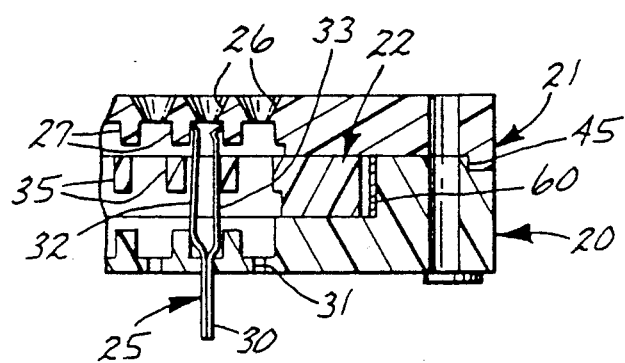
FIG. 7 is a detail vertical sectional view of the socket taken along line 7—7 of FIG. 5.

As illustrated in FIG. 7, a contact 25 comprises a thin strip of conductive material which is folded intermediate its ends to form a pin portion 30 adapted to extend through the base 20 and enter and be joined in an opening in a printed circuit board. The pin 30 extends through openings 31 formed between the inner and bottom surfaces of the base 20. The strip of material forming the contact 25 is then bent above the opening to limit the movement of the contact through the opening 31, and defines two arms 32 and 33 of a Y-shaped contact which arms extend through rectangular openings 35 in the cam plate 22. The free ends of the arms 32 and 33 terminate in the rectangular openings 27 in the top plate as described above.

Figure 4:
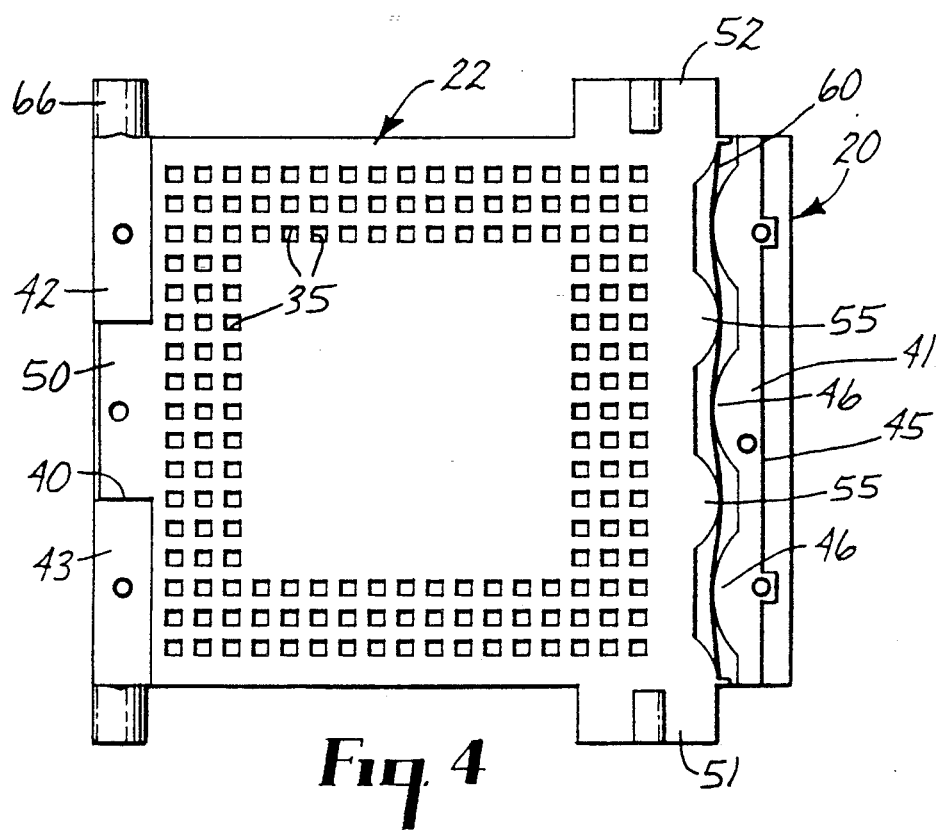
FIG. 4 is a plan view of the base and cam plate with the top plate removed and the contacts removed.
Figure 5:
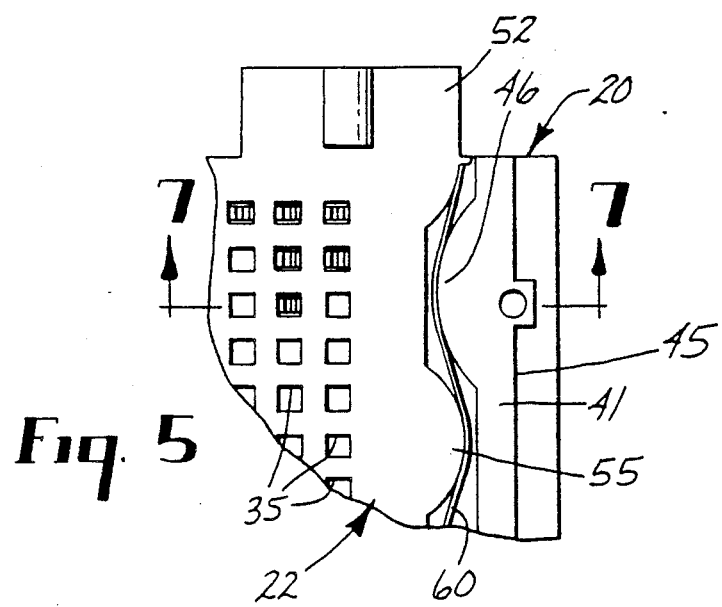
FIG. 5 is a fragmentary detail top view of the cam plate, base, spring and several contacts.
Figure 6:
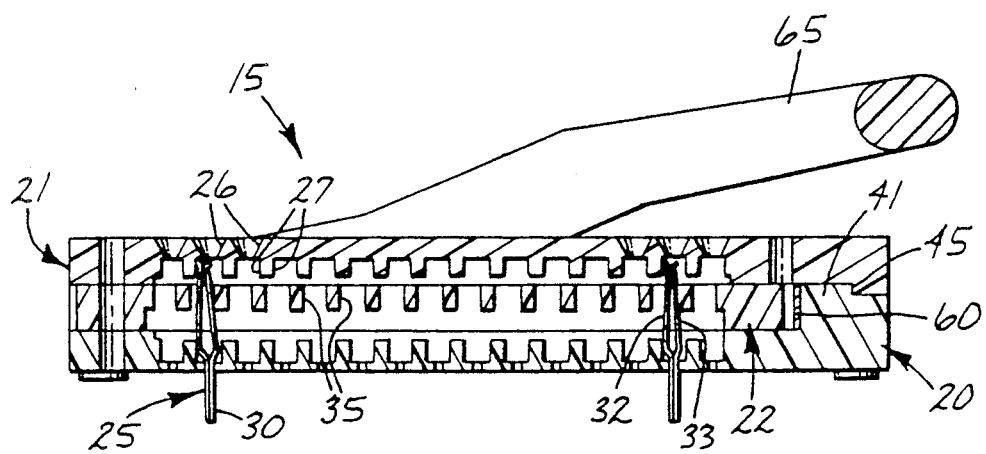
FIG. 6 is a vertical sectional view taken along the lines 6—6 of FIG. 2.

Referring now to FIGS. 4 and 5, the cam plate is illustrated in greater detail and its cooperation with the base 20 is best understood. The base 20 is formed with a recess 40 between the ends thereof and this recess is defined by a header 41 at one end and a pair of bosses 42 and 43 at the opposite end. The recess extends between the sides of the base. A shoulder 45 is formed adjacent one end next to the header 41 to secure a ledge of the cover plate 21 as shown in FIGS. 6 and 7. On the header 41 of the base, opposite the shoulder 45 is an undulating surface which is formed to define a plurality of spaced projecting nodes 46.

The cam plate 22 is disposed in the recess 40 in the base 20 and has a tongue 50 which extends between the bosses 42 and 43 and is a generally flat plate with the holes 35 extending between the opposed surfaces for receiving the arms 32 and 33 of the contacts 25. Projecting from the sides of the cam plate adjacent the opposite ends are arms or cam follower members 51 and 52. Along the end of the cam plate 22, between the cam members 51 and 52, the cam plate has an undulating surface disposed in opposed relationship to the undulating surface on the header 41. The surface on the cam plate is formed with spaced nodes 55 which project in a direction opposite nodes 46 but are disposed intermediate the nodes 46 in an alternating pattern permitting the surfaces to cross an imaginary line therebetween. A leafspring 60 is disposed between the surfaces to urge the surfaces apart and to urge cam plate 22 in a direction toward and against the bosses 42 and 43 and the spring 60 urges the cam plate to bear against the arm 33 of each of the contacts 25 urging the same in a direction toward the other arm 32 to close the contact, against the other arm or against a lead of the package 16 which is disposed between the arms 32 and 33. This construction makes the socket 15 normally closed. The purpose of the cam plate as thus described is illustrated best in FIG. 6 where a pair of contacts are illustrated with the web portions of the cam plate 22, disposed between the openings 35, bearing against the arms 33 and forcing the same against the arms 32.

With the socket 15 totally assembled, a U-shaped handle 65 is pivotally mounted on opposed trunnions 66 extending outwardly from opposite sides of the base 20 adjacent the end where the bosses 42 and 43 are located. The handle 65 is joined to two links or thrust members 67 and 68 which are disposed at opposite sides of the socket 15 and each is formed with a rectangular opening to receive therein the arms 51 and 52 of the cam plate 22, respectively. The thrust arms 67 and 68 are joined to the arms of the handle 65 intermediate the ends by recessed pockets in the under surface of the arms of the handle 65, and they are retained in the pockets by pins 70, only one of which is shown. Downward movement of the handle 65 by an automatic loading and unloading device places a force on the thrust arms 67 and 68 to urge them in a direction such that the cam plate 22 moves toward the header 41 parallel to the base and the top plate and against the force of spring 60, allowing the arms 32 and 33 of the contacts 25 to open due to their own normal resilience and provide an opening for the easy insertion of the leads from the package 16. When the handle 65 is released, the spring 60, acting between the nodes 46 and the nodes 55, drives the cam plate against the arms 33 causing them to close onto the leads of the package 16. This arrangement of the handle 65 and the thrust arms 67 and 68 provides a force triangle consisting of one link between the trunnion 66 and the arm 51, the second being between the trunnion 66 and the pocket in the arm of handle 65 adjacent the pivot pin 70, and the third link being the thrust arm 67, between the pocket and the arm 51. Vertical downward pressure on the bar connecting the arms of the handle 65 is translated to essentially vertical pressure at the mid-point of each arm. This force is translated into a compression load on the second and third links of the force triangle which is translated to a sliding force on the arms 51 and 52 of the cam plate moving the arms 51 and 52, disposed in the ends of the trust arms, and the cam plate away from the base bosses 42 and 43 and against the force of the spring 60. The lengths of the components comprising the force triangle are chosen to provide a mechanical advantage such that the vertical force provided by the automatic loading equipment is approximately one-sixth that of the force required to move the cam against the internal spring.

The contacts 25 are normally open contacts which provide easy insertion of the leads of the package 16 into the contacts and the spring 60 is interposed to urge the cam plate in a direction to close the arms of the contacts against the leads of the package. The spring 60 is so positioned between the nodes 46 and 51 that in the event the material forming the base or the camming surfaces defined by the webs between the holes 35 in the cam plate should cold flow to change the contact force against the leads, the spring serves to make up for any change in force resulting. The normal desired force at each electrical connection is 50 grams.

Figure 8:
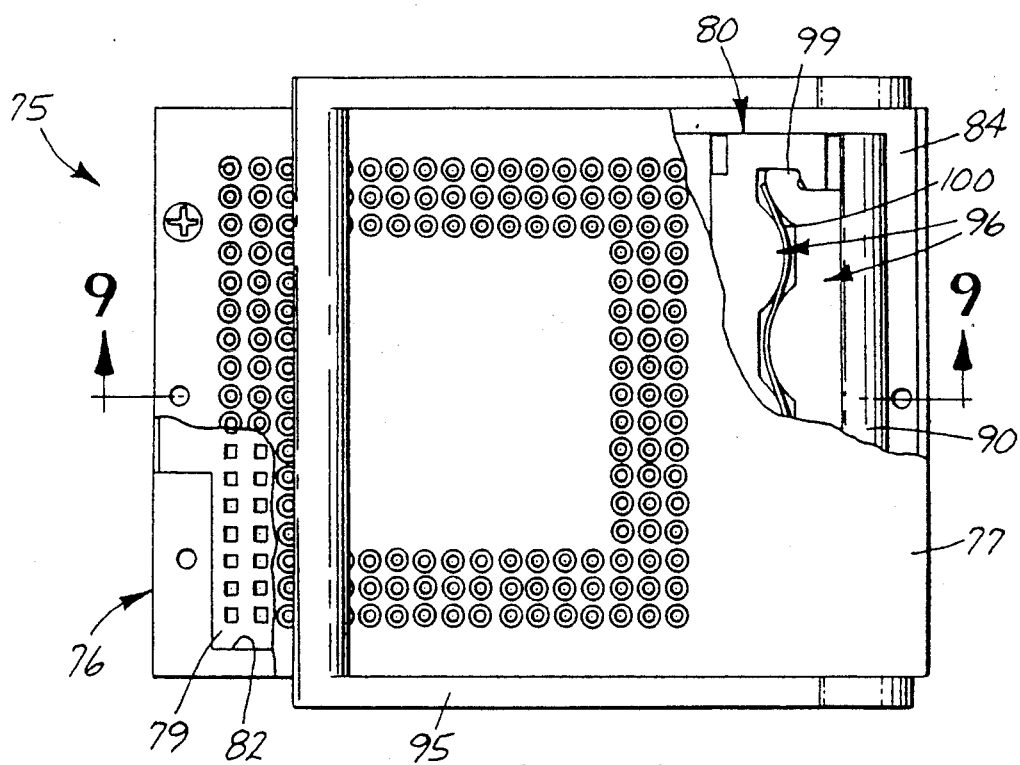
FIG. 8 is a plan view of a second embodiment of a socket according to the present invention, showing the top plate partially broken away to show the interior members.
Figure 9:
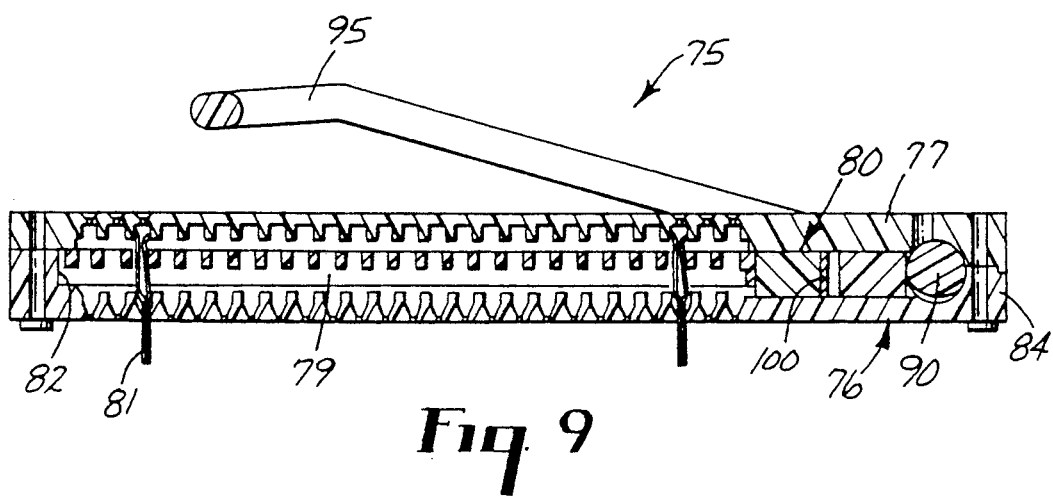
FIG. 9 is a vertical sectional view of the socket of FIG. 8 taken along the line 9—9 of FIG. 8.
Figure 10:
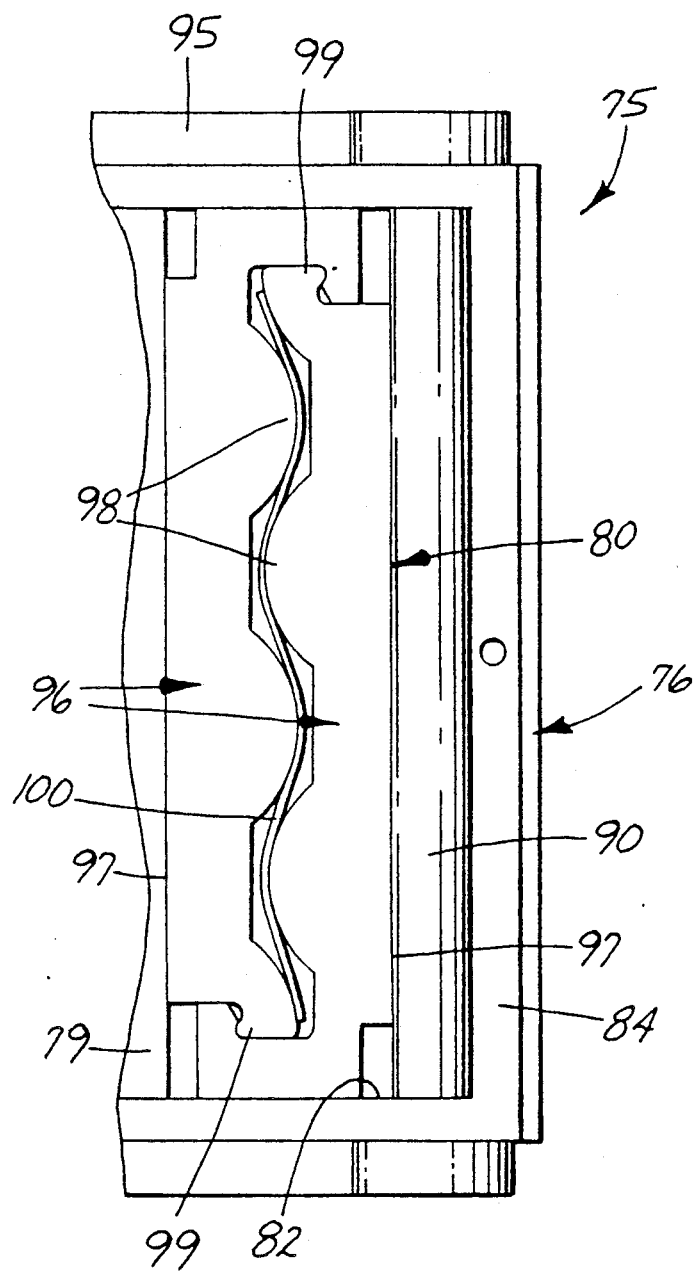
FIG. 10 is a plan view of the spring compensator of the second embodiment of the present invention.

Second embodiment of the present invention is illustrated in FIGS. 8, 9 and 10. The socket 75 of this embodiment is comprises a base 76, a top plate 77 and a cam plate 79. The socket also comprises a compensator 80 which serves to restrict a premature failure of a normally open pin grid array socket.

The base, top plate and cam plate are formed with openings to receive the plurality of contacts 81 disposed in the predetermined array and to receive the leads of an integrated circuit package. The openings in the members and the contacts are similar to the openings and contacts described above. The cam plate however is confined within a rectangular recess 82 in the base 76 which recess is larger than the cam plate 79 to receive the compensator 80 and a cam shaft 90 between one end of the cam plate 79 and a header wall 84. The cam shaft 90 extends beyond the ends of the base 76 and is connected to the free ends of the arms of a U-shaped handle 95. The cam shaft is provided with one generally flat side which, when the handle is raised is adjacent to the compensator 80 allowing the contacts to open and force the cam plate 79 and the compensator toward the header wall 84. When the cam shaft 90 is rotated to the position of FIG. 9, the lobes on the cam urge the compensator 80 and cam plate in a direction toward the opposite end of the base forcing the arms of the contacts toward engagement.

When the package 16 is placed on the socket 75, the leads thereof penetrate the openings and fit between the arms of the contacts 81. The handle is then rotated to the lower position of FIG. 9 and the cam shaft 90 forces the compensator 80 against the cam plate 79 and the continued force drives the arms of the contacts against the leads. The cam shaft 90 then drives the compensator to apply a resilient force against the cam plate to initially relieve some of the cam force but to provide a spring tension against the cam plate to protect against premature failure which might result from cold flow.

The compensator 80 comprises a pair of identical blocks 96 formed preferably of metal, each with a flat side surface 97 and an undulating surface having spaced nodes 98. A hook 99 is formed at one end and a socket is formed at the other end to receive a hook of the second block. The sockets have sufficient room to permit movement of the hooks and to accept a leaf spring 100 between the undulating surfaces. The serpentine shape accepted by the flat leaf spring as placed between the nodes 98, forces the blocks apart to the limit allowed by the hooks and sockets and places the spring in a pre-loaded condition near the top end of its force range. If the spring has a low rate, which is the force divided by the deflection, then it must be deflected an appreciable distance to apply the required pressure. The interlocking shape of the blocks 96 prevent the spring from returning to a straight condition with no load on the spring. When deflected by the cam shaft against the resistance of the leads in the contacts the spring accepts the increased movement of the cam shaft and maintains the pressure and there is very little change is spring pressure with the predicted amount of movement resulting from cam shaft. The movement however is also sufficient to accept any change predicted over time do to the factors that could change the proper operation of the socket. The compensator 80 also provides a simple device for accepting shock loads in drive systems where a predetermined high spring load is desired to restrict damage to a part but the amount of movement is never going to exceed a predetermined maximum value and excessive movement is not desired.

Having described the present invention with regard to several embodiments, it will be appreciated that those skilled in the art may find modifications not described but all such modifications are contemplated that come within the scope of the appended claims.

I claim:

1. A low insertion force socket for receiving an integrated circuit package with multiple leads in an array, said socket comprising:

an insulative base having means for receiving a plurality of contacts, an insulative top plate having openings for receiving the leads of a said package, a plurality of individual contacts supported in said base for making connection between the leads of a said package and an external electronic article, said contacts each comprising at least one arm which is movable into engagement with a lead of a said package, a cam plate formed of insulative material positioned between said base and said top plate and having means for receiving each contact and for moving said at least one arm of each contact between an open and a closed position upon movement of said cam plate in relationship to said base and said top plate, spring means for forcing said cam plate in a direction to move said at least one arm of each contact to close against and to make contact with said leads, said spring means comprising opposed undulating surfaces which have spaced nodes to allow the surfaces to cross a line therebetween which line is generally perpendicular to the desired direction of movement of said cam plate, and a flat leaf spring interposed between said surfaces and stressed to a serpentine path for producing a force to urge said cam plate in said direction to move said arms of said contacts to a closed position, and means for releasing the pressure from said spring means for releasing said arms of said contacts from said force of said cam plate.

2. A socket according to claim 1 wherein said base and said cam plate are formed with said opposed undulating surfaces, and said cam plate has arms extending therefrom affording means for releasing said force from said cam plate from said arms.

3. A socket according to claim 1 wherein said base is formed with a recess to receive said cam plate and said spring means, and wherein said means for releasing the pressure from said spring means comprises handle means connected to said base and said cam plate for moving said cam plate in a second direction opposite to said direction of movement under the force of said spring.

4. A socket according to claim 1 wherein said base is formed with a recess to receive said cam plate, said spring means and said means for releasing the pressure from said spring means, and wherein said spring means comprises a pair of blocks, which blocks are shaped to interfit at their ends and said blocks have said opposed undulating surfaces with intermeshing nodes to define said serpentine path therebetween with said flat leaf spring positioned between said undulating surfaces for urging the same apart against the limit of the interfitting ends to place a load on said spring.

5. A socket according to claim 4 wherein said means for releasing the pressure from said spring means comprises a cam shaft placed in said recess in said base and handle means for rotating said cam shaft, said cam shaft having a profile for urging said spring means into compressive engagement with said cam plate and for releasing said cam plate from said spring means to allow the contacts to open.

6. A low insertion force socket for receiving an integrated circuit package with multiple leads in an array, said socket comprising:

a plurality of generally open Y-shaped contacts defining a pin portion and normally open arms.

an insulative base having recess means and means for receiving the pin portions of said contacts.

an insulative top plate having openings for receiving the leads of a said package and the ends of said arms of said contacts.

an insulative cam plate positioned in said recess and between said base and said top plate and having means for receiving the arms of each contact therethrough and for moving at least one arm of each contact between an open and a closed position upon movement of said cam plate in one direction in relationship to said base and said top plate.

said base and said cam plate being formed with opposed undulating surfaces which have spaced nodes to allow the surfaces to cross a line therebetween, and a flat leaf spring interposed between said surfaces and stressed to a serpentine path for placing a force on said spring sufficient to urge said cam plate in said one direction against the arms of said contacts to move the same to a closed position, and means for releasing the pressure from said spring for releasing said arms of said contacts from said force of said cam plate.

* * * * *